(12) United States Patent
Chang et al.

(10) Patent No.: US 8,703,508 B2
(45) Date of Patent: Apr. 22, 2014

(54) METHOD FOR WAFER-LEVEL TESTING DICED MULTI-CHIP STACKED PACKAGES

(75) Inventors: Kai-Jun Chang, Hsinchu (TW);
Yu-Shin Liu, Hsinchu (TW);
Shin-Kung Chen, Hsinchu (TW);
Kun-Chih Chan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 13/585,102

(22) Filed: Aug. 14, 2012

(65) Prior Publication Data

US 2014/0051189 A1 Feb. 20, 2014

(51) Int. Cl.
*H01L 23/488* (2006.01)

(52) U.S. Cl.
USPC 438/15; 257/737; 257/E21.499; 257/E23.023; 257/E21.502; 257/E23.069

(58) Field of Classification Search
USPC .............................. 438/15, 118, 127, 458, 462
See application file for complete search history.

(56) References Cited

U.S. PATENT DOCUMENTS

| 2009/0236739 A1* | 9/2009 | Chen et al. ................. 257/737 |
| 2010/0261315 A1* | 10/2010 | Fan ............................. 438/118 |
| 2011/0074017 A1 | 3/2011 | Morifuji et al. |
| 2013/0076384 A1* | 3/2013 | Chang ..................... 324/754.01 |

* cited by examiner

*Primary Examiner* — Chuong A Luu
*Assistant Examiner* — Rodolfo Fortich
(74) *Attorney, Agent, or Firm* — Muncy, Geissler, Olds & Lowe, P.C.

(57) ABSTRACT

Disclosed is a method for wafer-level testing a plurality of diced multi-chip stacked packages. Each package includes a plurality of chips with vertically electrical connections such as TSVs. Next, according to a die-on-wafer array arrangement, the multi-chip stacked packages are fixed on a transparent reconstructed wafer by a photo-sensitive adhesive, and the packages are located within the component-bonding area of the wafer. Then, the transparent reconstructed wafer carrying the multi-chip stacked packages can be loaded into a wafer tester for probing. Accordingly, the wafer testing probers in the wafer tester can be utilized to probe the testing electrodes of the stacked packages so that it is easy to integrate this wafer-level testing method especially into TSV packaging processes.

15 Claims, 14 Drawing Sheets

FIG. 7C

METHOD FOR WAFER-LEVEL TESTING DICED MULTI-CHIP STACKED PACKAGES

FIELD OF THE INVENTION

The present invention relates to a manufacture method of semiconductor devices and more specifically to a method for wafer-level testing a plurality of diced multi-chip stacked packages.

BACKGROUND OF THE INVENTION

Multi-chip packages are high-density packaging technology, i.e., a plurality of vertically stacked chips are packaged inside a package. The current methodology is to stack chips one by one on a wiring substrate and then packaging and testing through the wiring substrate, however, the footprint and the package thickness are increased.

In order to reduce the package dimension of a multi-chip package, conventionally substrates were eliminated by vertically stacking a plurality of wafers in wafer form, then the stacked wafers were singluated into substrate-less multi-chip packages or called "dice cube", one of relative technologies is disclosed in US Patent No. 2011/0074017 taught by MORIFUJI et al. However, bad chips were inevitably existed in a wafer with random locations from wafer to wafer, therefore, the stacked yield of substrate-less multi-chip packages would be greatly reduced. Moreover, when substrates were eliminated, pitches of the external electrodes and the corresponding testing electrodes of a multi-chip package would become smaller reducing from several hundred micrometer down below 100 um where pogo pins of the conventional package tester can not be implemented for final test. There are two solutions to test chip-stacked packages with smaller-pitch I/O electrodes. One is to surface-mount untested substrate-less chip-stacked packages on a module substrate as an electronic module in advance then to perform module-level testing by skipping package-level testing where the electrical interconnections between the stacked chips in a stacked package can not be screened out before SMT leading to SMT rework or fail. The other one is to prepare untested substrate-less stacked packages firstly, then to surface-mount the package on a wiring interposer usually made of Si with fan-out circuitry and electrodes, then the interposer is loaded into a package tester for final test (FT) and then dismounted from the interposer where the processes are complicated with expensive testing cost.

SUMMARY OF THE INVENTION

The main purpose of the present invention is to provide a method for wafer-level testing a plurality of diced multi-chip stacked packages to meet fine-pitch probing requirements of diced multi-chip stacked packages which can easily be integrated with TSV (through-hole via) processes.

The second purpose of the present invention is to provide a method for wafer-level testing a plurality of diced multi-chip stacked packages to screen out good packages from bad packages before SMT on modules to avoid rework due to SMT bad packages and to achieve lower testing cost.

According to the present invention, a method for wafer-level testing diced multi-chip stacked packages is revealed. Firstly, the plurality of multi-chip packages are provided where each multi-chip package includes a plurality of chips vertically stacked together and each multi-chip package has a top surface, a bottom surface, and a plurality of testing electrodes disposed on the top surface. Then, according to a die-on-wafer array arrangement, the multi-chip stacked packages are fixed on a transparent reconstructed wafer where the transparent reconstructed wafer has a photosensitive adhesive and includes a plurality of component placement regions defined by a plurality of specific alignment marks such as a chip array defined by X-axes and Y-axes, central alignment marks, corner alignment marks, or peripheral alignment marks. The photosensitive adhesive adheres to the bottom surfaces of the multi-chip stacked packages so that the multi-chip stacked packages are located inside the component placement regions without covering the X-axes and Y-axes, the corner alignment marks, or the peripheral alignment marks. Then, the transparent reconstructed wafer with the adhered multi-chip stacked packages is loaded into a wafer tester. Then, the testing electrodes of the multi-chip stacked packages are probed by a plurality of probes of a probe card installed inside the wafer tester to electrical test the multi-chip stacked packages to screen out good packages from bad packages before surface mounting. Finally, after wafer testing, the photosensitive adhesive on the transparent reconstructed wafer is radiated by light to erase adhesion of the photosensitive adhesive and then to pick up and sort out the tested multi-chip stacked packages from the transparent reconstructed wafer.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

According to the preferred embodiment of the present invention, the method for wafer-level testing a plurality of diced multi-chip stacked packages is illustrating from FIG. 1A to FIG. 1E for component cross-sectional views in primary steps. According to wafer-level testing methodology, firstly a plurality of diced multi-chip stacked packages 100 are provided. The detail sub-processing steps of providing the diced multi-chip stacked packages 100 are further illustrated from FIG. 2A to FIG. 2E for component cross-sectional views.

Figure 1A:
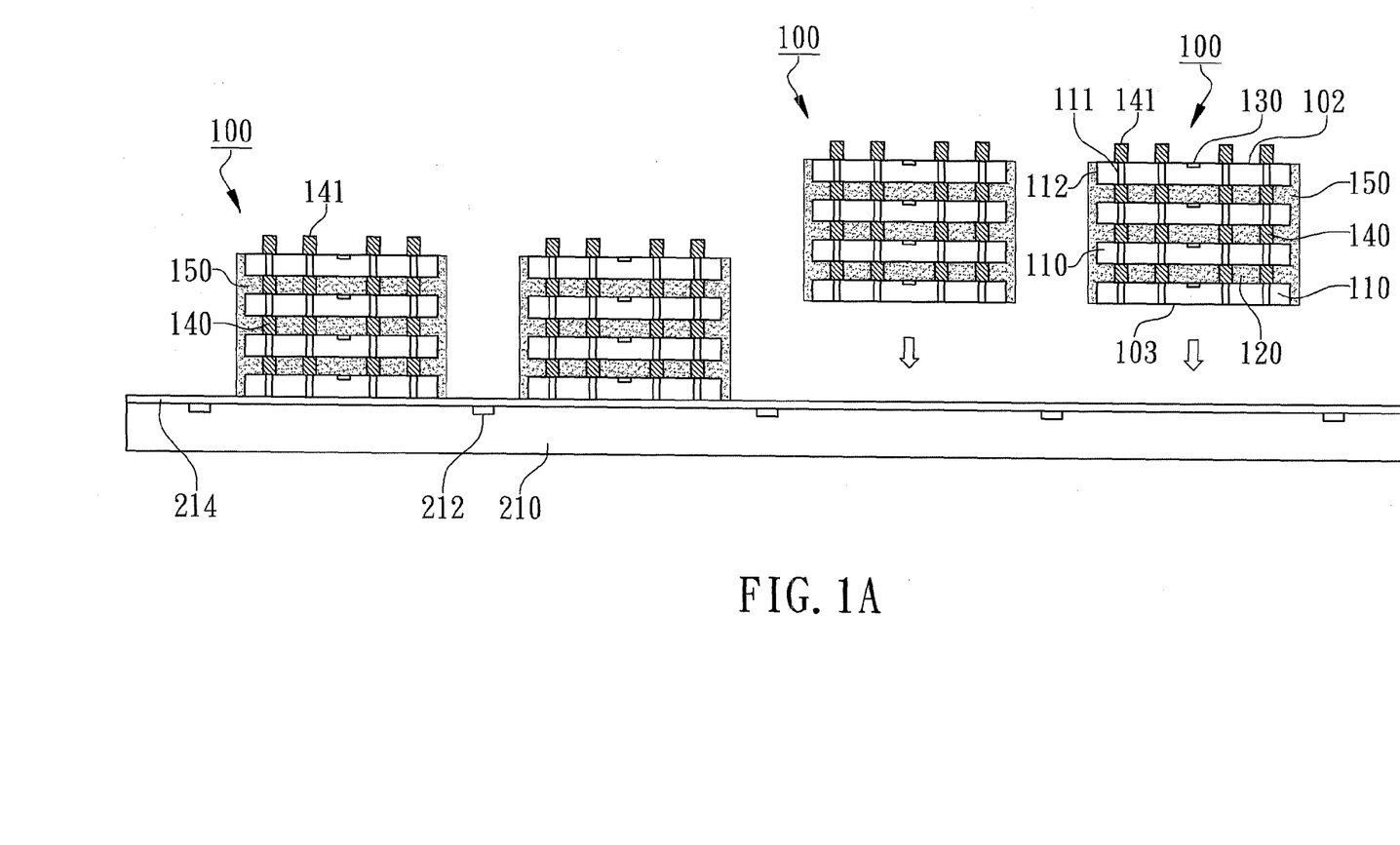
FIGS. 1A to 1E are component cross-sectional views illustrating the major processing steps of the method for wafer-level testing a plurality of diced multi-chip stacked packages according to the preferred embodiment of the present invention.

As shown in FIG. 1A, a plurality of multi-chip stacked packages 100 are provided which have been singulated where substrate-less packages are preferred. Each multi-chip stacked package 100 includes a plurality of chips 110 vertically stacked together which are preferably picked-up from the same singulated wafer and are made of semiconductor materials. The desired IC circuitry is fabricated on the active surfaces of the chips 110 with the functions of memory, logic, or micro-processor where the memory usually is non-volatile memory such as NAND flash memory. Moreover, each multi-chip stacked package 100 has a top surface 102, a bottom surface 103, and a plurality of testing electrodes 130 disposed on the top surface 102 where the top surface 102 is the external jointing surface and the bottom surface 103 is opposing to the top surface 102. In the present embodiment, the top surface 102 is formed by one of the active surfaces of the chips 110 and the bottom surface 103 is formed by one of the bottom surfaces of the chips 110. The testing electrodes 130 are electrically connected to the IC circuitry of the chips 110 as testing electrodes. In the present embodiment, the testing electrodes 130 are bonding pads or metal bumps. To be more specific, a plurality of TSVs (Through Silicon Vias) 111 are disposed inside each chip 110 and a plurality of micro bumps 140 are disposed inside the gaps between the adjacent vertically stacked chips 110 to electrically connect the TSVs 111. In the present embodiment, each multi-chip stacked package 100 further includes a plurality of external bumps 141 such as copper pillars, solder balls, or metal bumps disposed on the top surface 102 having the same locations, materials, and dimensions on the chips 110 as the micro bumps 140 where the external bumps 141 are electrically connected to the testing electrodes 130 through RDL (Redistribution layer, not shown in the figures). Furthermore, the pitches of the testing electrodes 130 range from 60 um to 100 um where the wafer-level testing method of the present invention is specifically implemented for the testing electrodes 130 having pitches less than 100 um. The pitches of the external bumps 141 can be equal to or greater than the pitches of the testing electrodes 130. In a different embodiment, the external bumps 141 can be eliminated where the testing electrodes 130 can be implemented as the external electrodes of the multi-chip stacked packages 100. The multi-chip stacked package 100 can easily be fabricated using the existing semiconductor equipment and processes.

Figure 4:
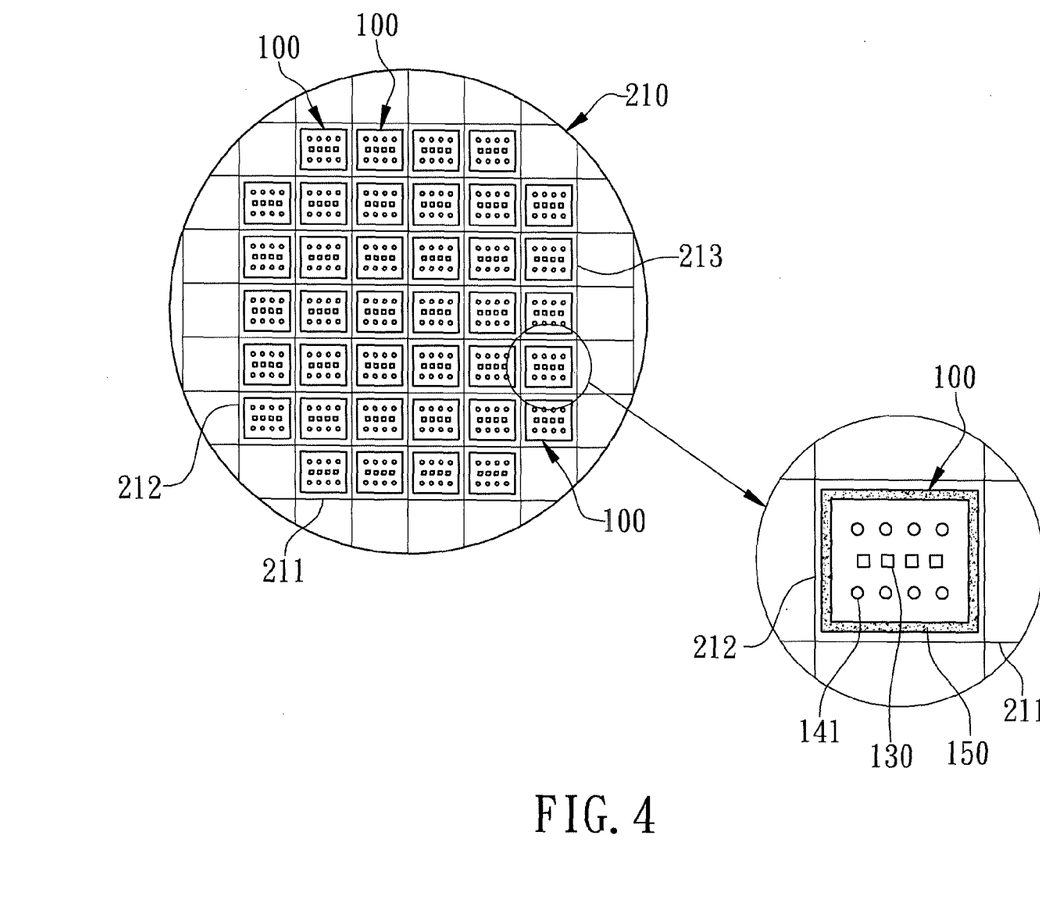
FIG. 4 is a top view of a transparent reconstructed wafer carrying a plurality of multi-chip stacked packages according to the preferred embodiment of the present invention.

As shown in FIG. 1A and FIG. 4, the multi-chip stacked packages 100 are fixed on a transparent reconstructed wafer 210 according to a die-on-wafer array arrangement where "die-on-wafer array" means that the array of a plurality of dies relative to a wafer having the dies before dicing so that the multi-chip stacked packages 100 are arranged in an array like chips arranged on and diced from a wafer. The appearance of the transparent reconstructed wafer 210 just likes a wafer in shape and in dimension such as an 8" wafer, a 12" wafer, or an 18" wafer which can be loaded into a wafer tester. In the present embodiment, the transparent reconstructed wafer 210 can be a glass tray with excellent transparency, good structural strength, and similar CTE (Coefficient of Thermal Expansion) to the one of semiconductor materials. Moreover, a photosensitive adhesive 214 is disposed on the surface of the transparent reconstructed wafer 210 to adhere the bottom surfaces 103 of the multi-chip stacked packages 100 where the photosensitive adhesive 214 has good adhesion before radiating light and will lose its adhesion after radiating light with a specific wavelength such as UV light. The transparent reconstructed wafer 210 can be recycled after repeating the following processes such as removing the radiated photosensitive adhesive, cleaning and drying, re-disposing the fresh photosensitive adhesive without light radiation, adhering the components, radiating light. Furthermore, in FIG. 4, the transparent reconstructed wafer 210 has a plurality of component placement regions 213 defined by a plurality of specific alignment marks. In the present embodiment, the alignment marks include a plurality of X-axes 211 and a plurality of Y-axes where X-axes 211 and Y-axes 212 are perpendicular to each other to define the largest component placement regions 213. The multi-chip stacked packages 100 are placed within the component placement regions 213 by adhesion of the photosensitive adhesive 214 where the multi-chip stacked packages 100 do not cover the X-axes 211 and the Y-axes 212 to achieve better alignment recognition as shown in FIG. 4. Preferably, the X-axes 211 and the Y-axes 212 are extended to the peripheral edges of the transparent reconstructed wafer 210 to simulate wafer scribe lines for easy alignment. The X-axes 211 and the Y-axes 212 are preferably half-etched linear trenches for easy light radiation. Alternatively, the X-axes 211 and the Y-axes 212 may be straight ink lines.

Figure 1B:
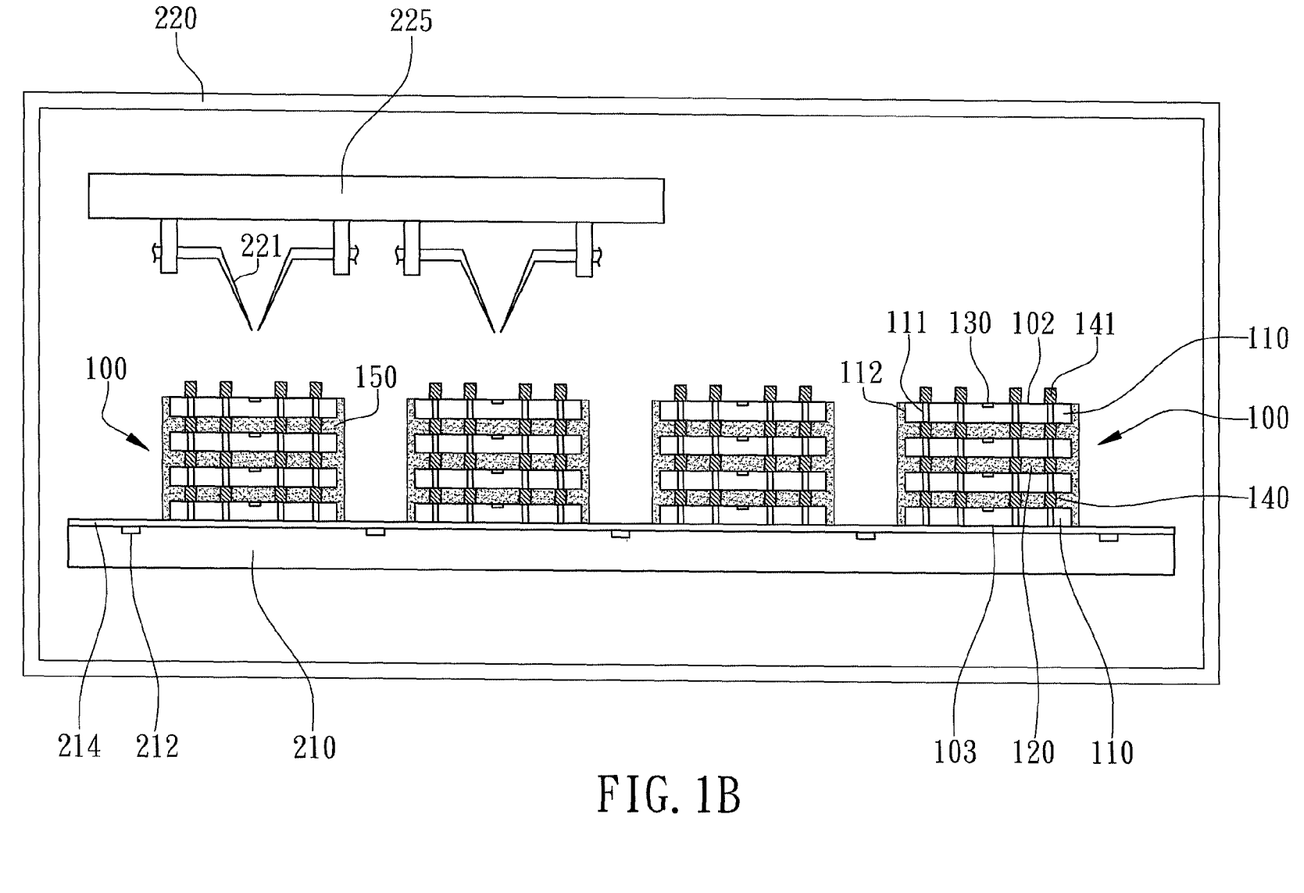

Then, as shown in FIG. 1B, the transparent reconstructed wafer 210 carried with the multi-chip stacked packages 100 is loaded into a wafer tester 220 where the transparent reconstructed wafer 210 can be adhered to the conventional dicing tapes of the dicing frame (not shown in the figure) so that the transparent reconstructed wafer 210 is disposed at the center of the dicing frame, i.e., the multi-chip stacked packages 100 can be completely simulated as the singulated chips adhered to the dicing frame after dicing, therefore, the multi-chip stacked packages can easily be loaded and unloaded into the existing loading/unloading mechanism of a conventional wafer tester 220 for accurate alignment.

Figure 1C:
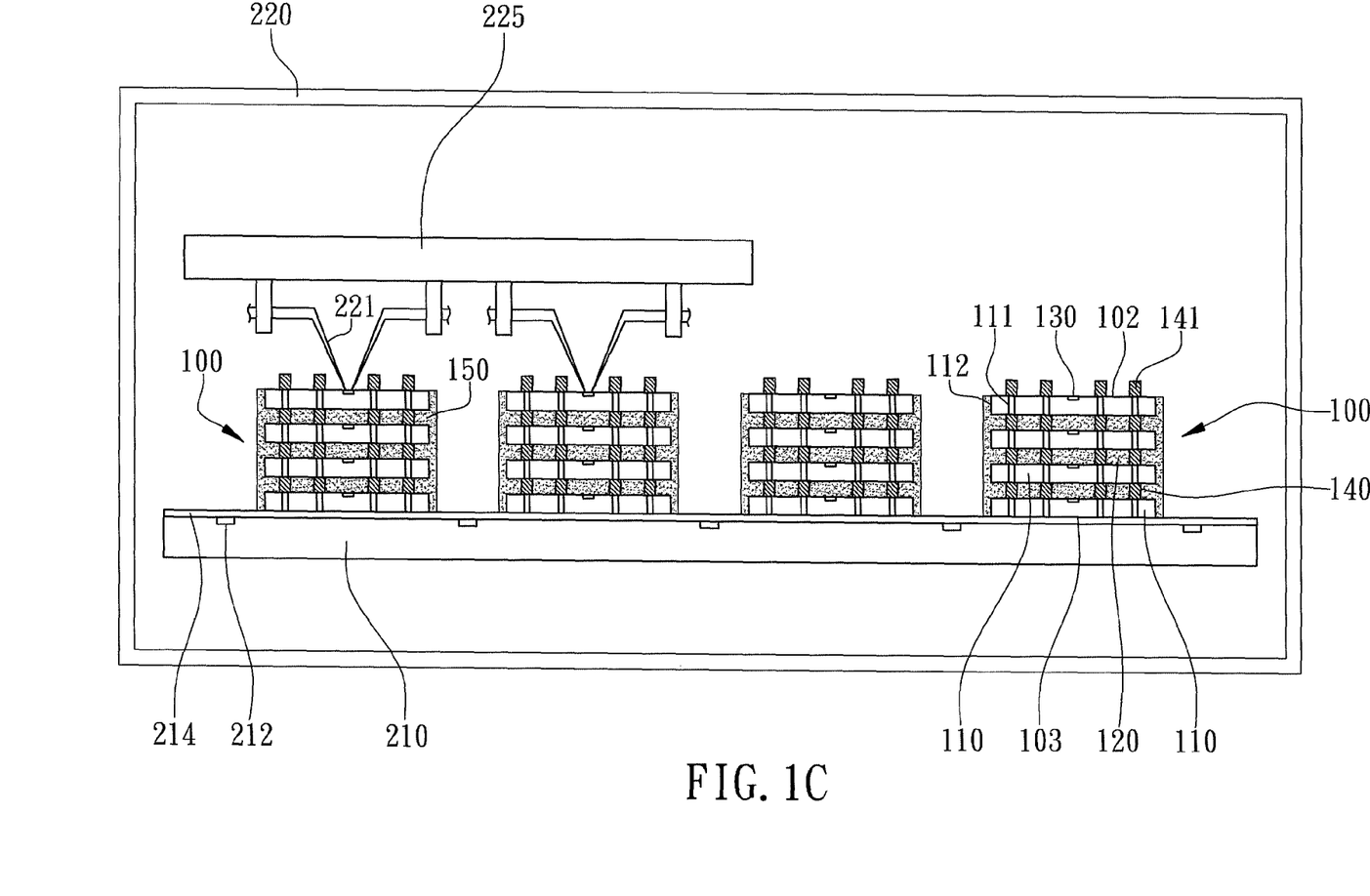
Figure 5:
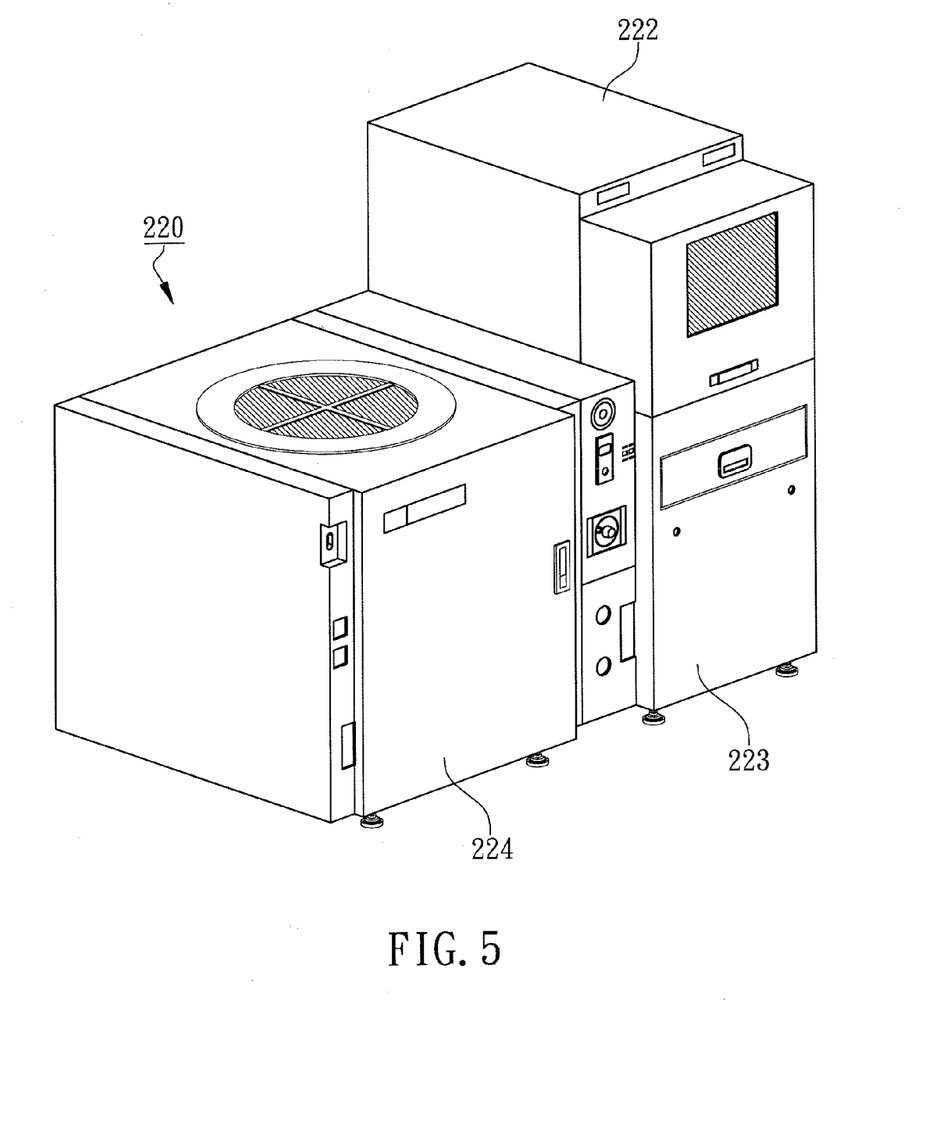
FIG. 5 is a three-dimensional view of a wafer tester implemented the method for wafer-level testing the diced multi-chip stacked packages according to the preferred embodiment of the present invention.

Then, as shown in FIG. 1C, a plurality of probes 221 disposed on a probe card 225 installed inside the wafer tester 220 contact and probe the testing electrodes 130 to electrically test the multi-chip stacked packages 100. As shown in FIG. 5, the wafer tester 220 includes a loading area 222, a transporting area 223, and a testing area 224. Conventional wafers as well as the transparent reconstructed wafer 210 can be loaded and unloaded at the loading area 222. After alignment check at the transporting area 223, the transparent reconstructed wafer 210 is transported to the testing area 224. The testing electrodes 130 of the multi-chip stacked packages 100 can be contacted and probed by the afore described probes 221 of a probe card 225 installed at the testing area 224 inside the wafer tester 220. Since the transparent reconstructed wafer 210 is similar to the dimension of a wafer, the transparent reconstructed wafer 210 can directly be loaded into the loading area 222 where the testing electrodes 130 of the multi-chip stacked packages 100 can be tested at the testing area 224 through the probes 221 of the probe card 225. Therefore, the testing cost of the multi-chip stacked packages 100 can be reduced and the testing efficiency can be increased where the requirements of fine-pitch probing can easily be met. The multi-chip stacked packages 100 do not need a wiring interposer with fan-out RDL and fan-out electrodes for electrical testing to confirm good electrical connections between the micro bumps 141 of the adjacent vertically stacked chips 110. Moreover, the method for wafer-level testing diced multi-chip stacked packages can directly sort out good packages from bad packages of the multi-chip stacked packages 100 after testing by the wafer tester 220.

Figure 1D:
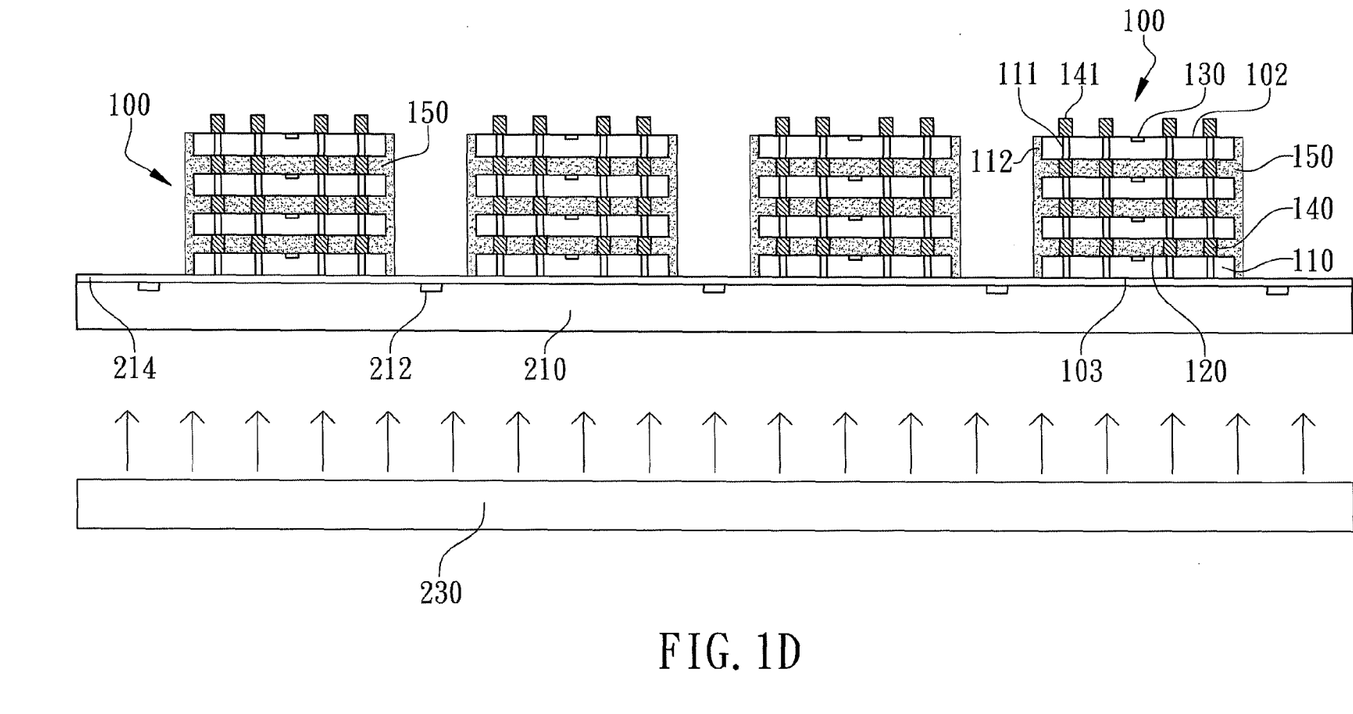

Then, as shown in FIG. 1D, the transparent reconstructed wafer 210 is unloaded from the wafer tester 220 after testing and is loaded into an aligner or a stepper where light with a specific wavelength such as UV light is radiating on the photosensitive adhesive 214 from and through the bottom of the transparent reconstructed wafer 210 by a light-radiation device 230 where the photosensitive adhesive 214 loses its adhesion.

Figure 1E:
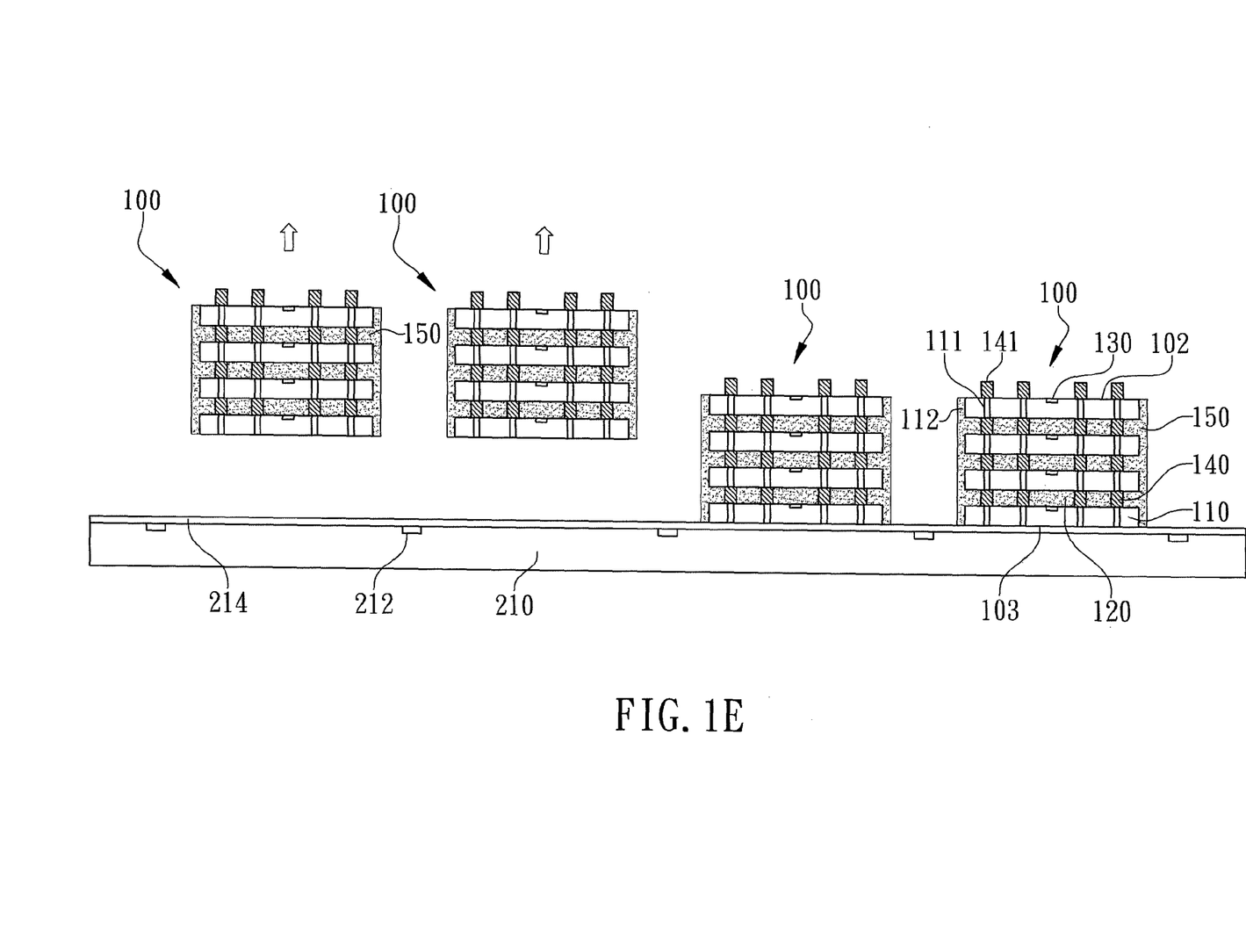

Finally, as shown in FIG. 1E, the multi-chip stacked packages 100 are picked and sorted from the transparent reconstructed wafer 210 to be packed or implemented in the following processes. Therefore, the method for wafer-level testing diced multi-chip stacked packages in the present invention can meet fine-pitch probing requirements of diced multi-chip stacked packages which can easily be integrated with TSV (through-hole via) processes.

The detail sub-processing steps of providing the multi-chip stacked packages 100 according to the method for wafer-level testing diced multi-chip stacked packages in the present invention are further described in detail from FIG. 2A to FIG. 2E.

Figure 2A:
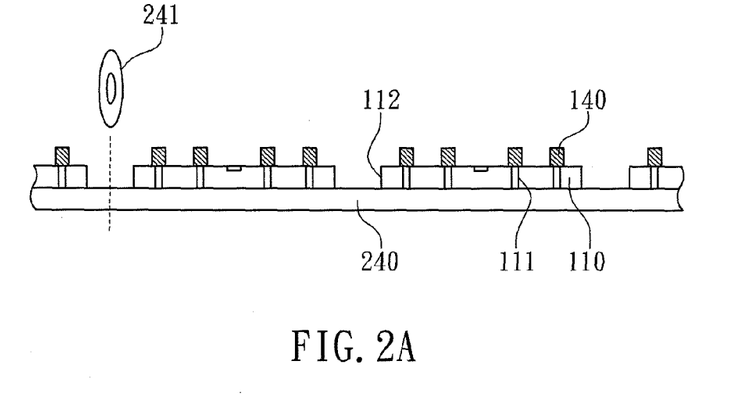
FIGS. 2A to 2E are component cross-sectional views illustrating the detailed sub-processing steps of providing of the diced multi-chip stacked packages according to the preferred embodiment of the present invention.

As shown in FIG. 2A, during dicing and after dicing processes, a plurality of chips 110 are attached to a wafer dicing tape 240 where the dicing tape 240 is adhered to a dicing frame (not shown in the figure). The chips 110 are formed from the same wafer by a dicing blade 241 singulating on the scribe lines of a wafer to form individual chips 110. After wafer-level testing, good chips 110 are sorted and collected.

Figure 2B:
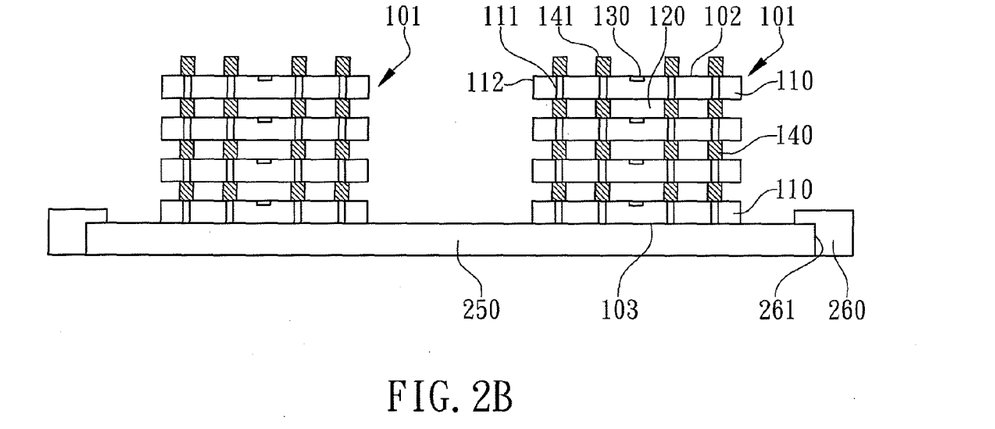

As shown in FIG. 2B, a plurality of substrate-less chip-stacked cubes 101 are disposed on an adhesive tape 250 where each substrate-less chip-stacked cube 101 consists of the chips 110 vertically stacked together. A gap 120 is formed between the adjacent vertically stacked chips 110 where the testing electrodes 130 are relatively away from the adhesive tape 250. The micro bumps 140 are disposed in the gaps 120 between the adjacent vertically stacked chips 110 to electrically connect the TSVs 111.

Figure 2C:
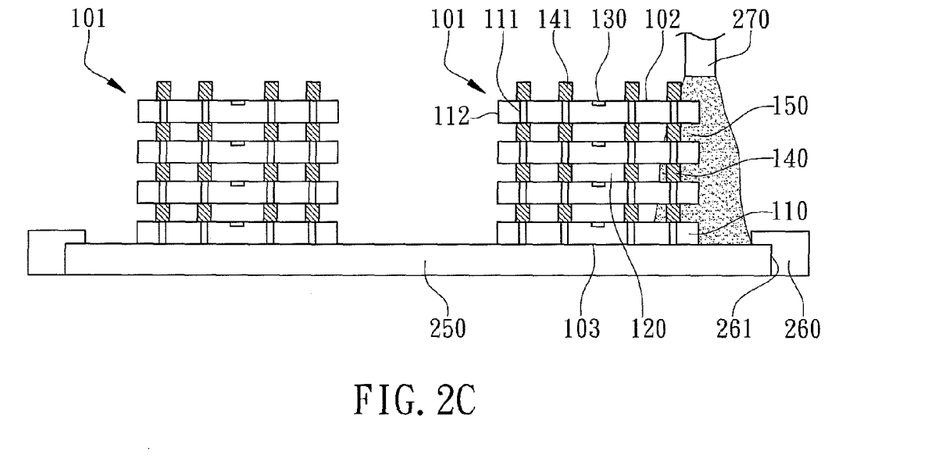
Figure 3:
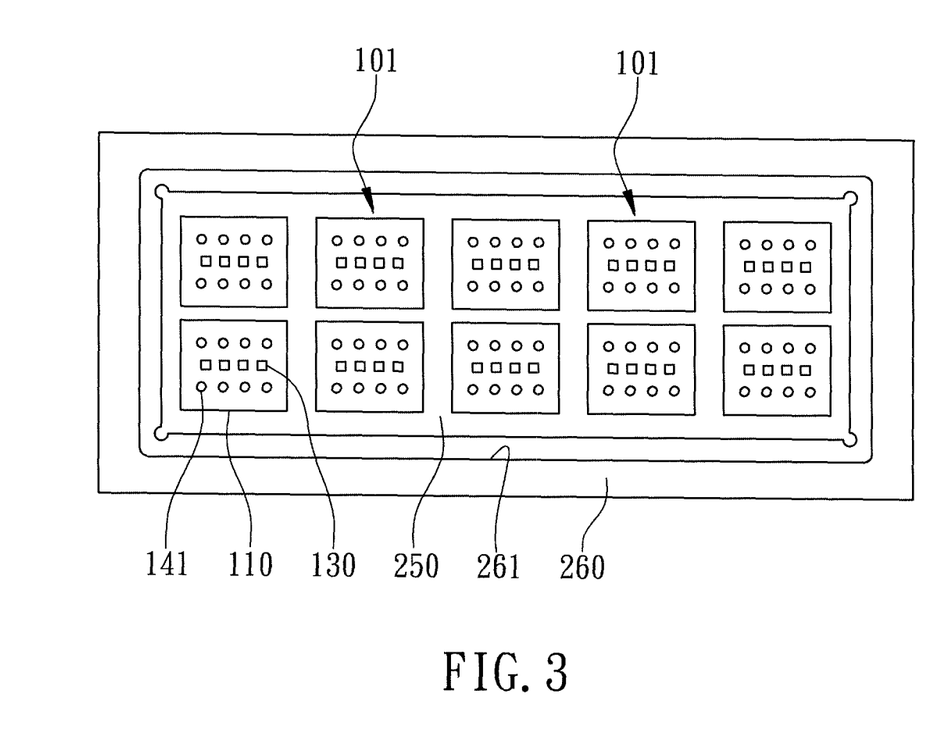
FIG. 3 is a top view of a strip-type tape carrier carrying a plurality of substrate-less chip-stacked cubes according to the preferred embodiment of the present invention.

As shown in FIG. 2C, an encapsulating material 150 is disposed on the adhesive tape 250 to completely fill the gaps 120 between the stacked chips 110 to further encapsulate the micro bumps 140. The encapsulating material 150 is dispensed on the adhesive tape 250 by a dispensing needle 270 containing the encapsulating material 150. With appropriate temperatures, filling time, and capillary forces, the encapsulating material 150 can completely encapsulate the gaps 120 between the stacked chips 110 followed by a pre-baking process to partially cure the encapsulating material 150. Moreover, the encapsulating material 150 may be underfilling materials, NCP (Non-Conductive Paste), or ACP (Anisotropic Conductive Paste). The afore processing steps of chip stacking and dispensing can be referred to corresponding description of FIG. 8A and FIG. 8B in the embodiment of US Published No. 2011/0057327. Or, in the present embodiment, as shown in FIG. 3, before disposing the substrate-less chip-stacked cube 101 on the adhesive tape 250 in the afore described processes, the adhesive tape 250 can be pre-disposed on the opening 261 of a strip-type tape carrier 260 to simulate a substrate strip so that the existing flip-chip die bonder and dispenser (or molding machine) of the semiconductor packaging equipment can be implemented. Furthermore, the strip-type tape carrier 260 can be implemented as a transporting carrier to transport the substrate-less chip-stacked cubes 101 into a baking oven.

Figure 2D:
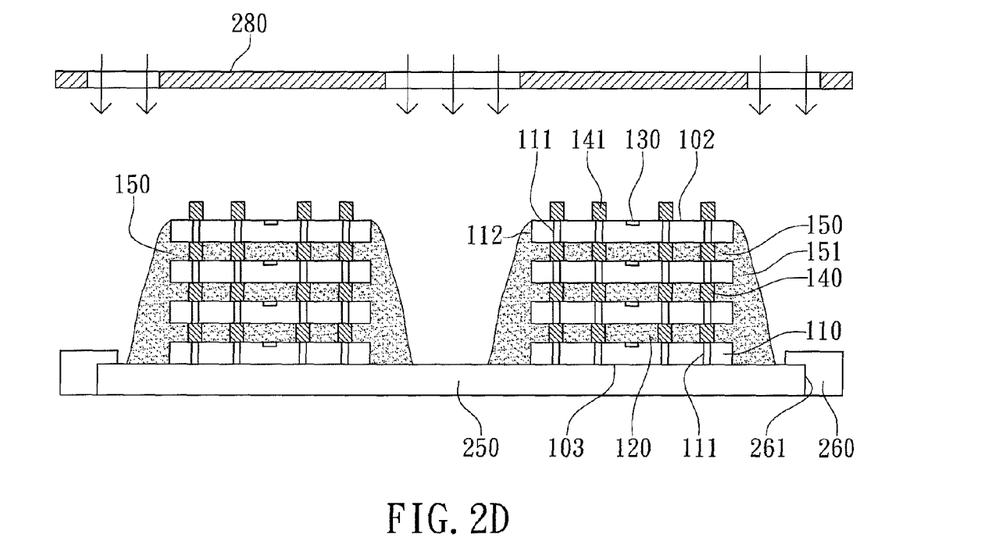
Figure 2E:
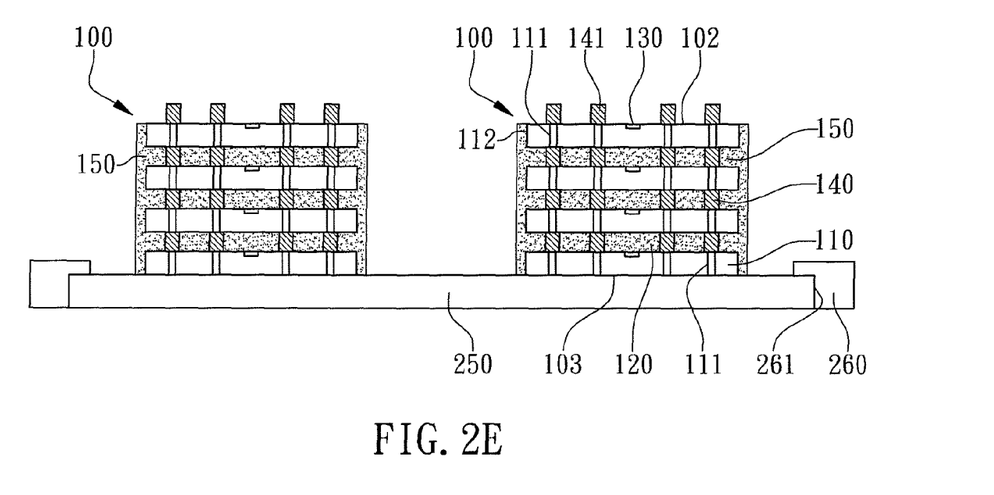

Moreover, as shown in FIG. 2D and FIG. 2E, the afore described processing step of providing the multi-chip stacked packages 100 further comprises: a bleeding removal step to remove a bleeding portion 151 of the encapsulation material 150 exceeding the footprint of the substrate-less chip-stacked cubes 101 after encapsulation material formation step. Preferably, after the afore bleeding removal step, the encapsulation material 150 still can encapsulate a plurality sidewalls 112 of the chips 110. One of the specific means to achieve packaging the stacked chips 110 is to use a positive-photoresist type underfill as the encapsulation material 150 where the bleeding removal step is to expose and develop the bleeding portion 151 of the encapsulation material 150. As shown in FIG. 2D, the bleeding portion 151 of the encapsulation material 150 is exposed and developed by using an exposing mask 280 where the opening pattern of the exposing mask 280 is slightly larger than the dimension of the chips 110 so that the bleeding portion 151 of the encapsulation material 150 can be radiated by light and reacted. As shown in FIG. 2E, the developing solution can resolve the bleeding portion 151 of the encapsulation material 150 where the sidewalls 112 of the chips 110 still can be encapsulated by the encapsulation material 150. When the encapsulation material 150 is post cured by baking, the afore multi-chip stacked packages 100 are fabricated. Another specific mean to achieve the encapsulation of the sidewalls 112 of the chips 110 by the encapsulation material 150 is to remove the bleeding portion 151 of the encapsulation material 150 by laser trimming.

Figure 6A:
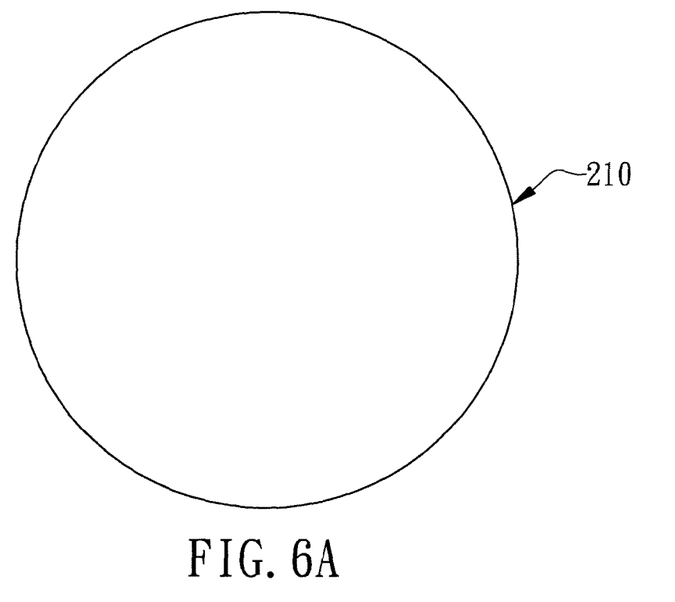
FIGS. 6A to 6C are top views of the transparent reconstructed wafer illustrating the implementation processing steps for manufacturing the transparent reconstructed wafer according to the preferred embodiment of the present invention.
Figure 6B:
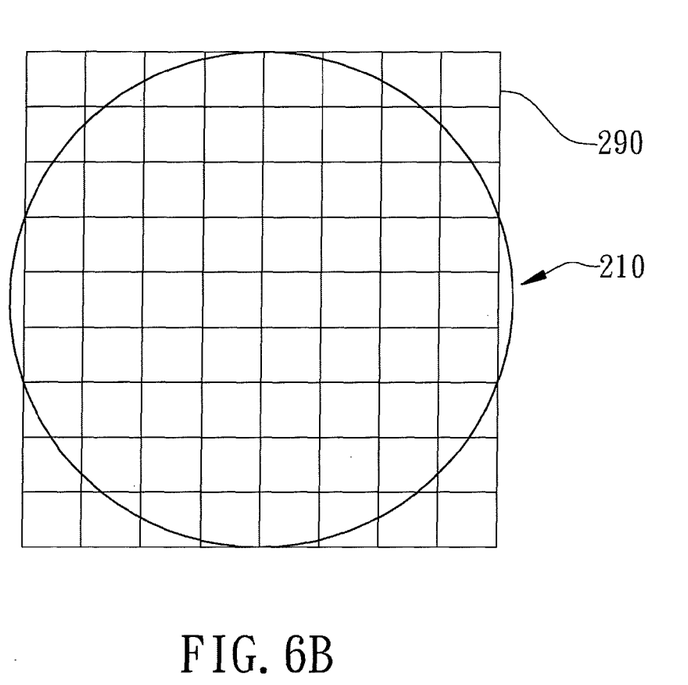
Figure 6C:
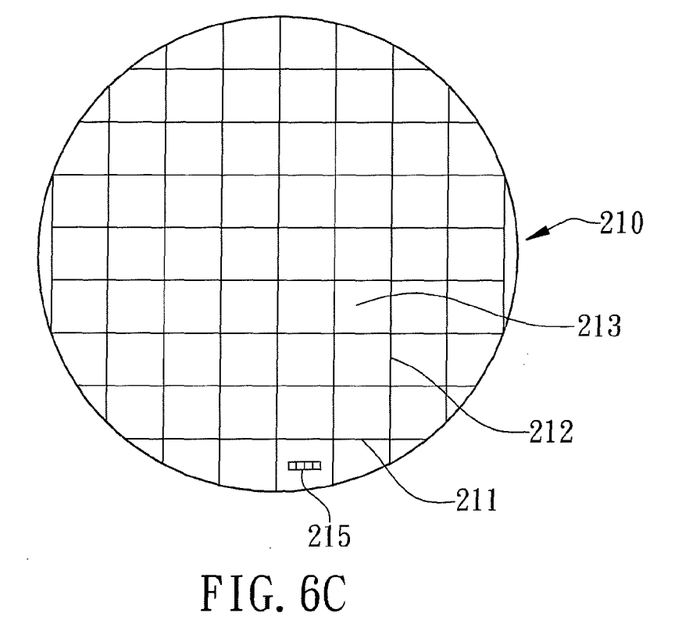
Figure 7A:
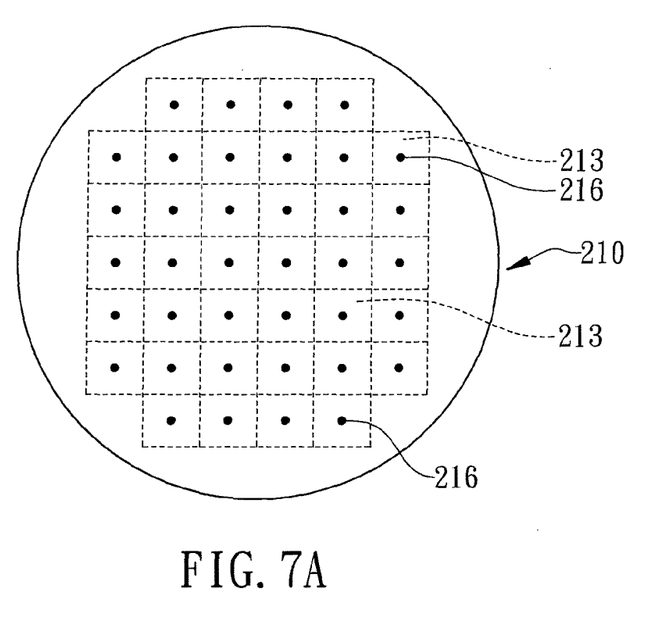
FIGS. 7A to 7C are top views of the transparent reconstructed wafers for illustrating different alignment marks according to several preferred various embodiments of the present invention.
Figure 7B:
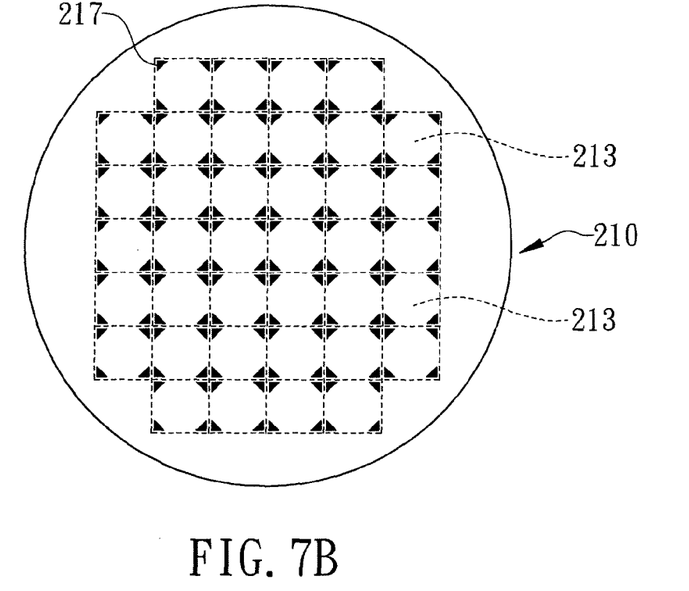
Figure 7C:
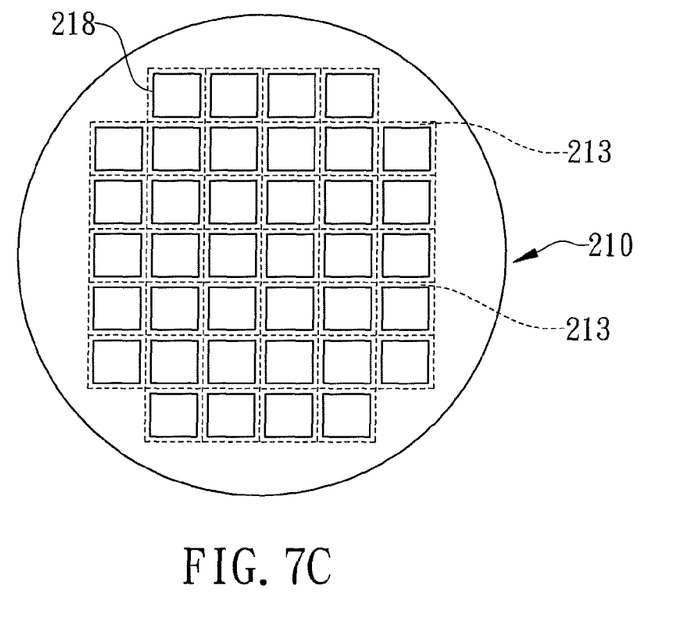

Furthermore, the fabrication of the transparent reconstructed wafer 210 is further described in detail as shown from FIG. 6A to FIG. 6C. Firstly, as shown in FIG. 6A, the transparent reconstructed wafer 210 is a blanket glass disc with the dimension as a 12" wafer with smooth and clean top and bottom surfaces. As shown in FIG. 6B, the X-axes 211 and the Y-axes 212 are fabricated on the top surface of the transparent reconstructed wafer 210 by using an alignment mask 290 aligned on the transparent reconstructed wafer 210 followed by etching processes or by deposition processes as shown in FIG. 6C. To be more specific, a wafer ID code 215 is disposed at the edges of the top surface or the bottom surface outside the component placement regions 213 of the transparent reconstructed wafer 210 to be recognized by bar code system which can be implemented to trace testing yield as the conventional wafer testing. Moreover, the X-axes 211 and the Y-axes 212 are not limited as the afore described alignment marks in the present invention. The transparent reconstructed wafer 210 having different alignment marks are shown from FIG. 7A to FIG. 7C for various embodiments. As shown in FIG. 7A, the alignment marks of the transparent reconstructed wafer 210 to recognize the component placement regions 213 include a plurality of central alignment marks 216 located at the central points of the corresponding component placement regions 213 which can be circles or crosses. As shown in FIG. 7B, the alignment marks of the transparent reconstructed wafer 210 to recognize the component placement regions 213 include a plurality of corner alignment marks 217 located at the corners of the component placement regions 213 which can be triangles or "L"-shaped. As shown in FIG. 7C, the alignment marks of the transparent reconstructed wafer 210 to recognize the component placement regions 213 include a plurality of peripheral alignment marks 218 located at the peripheries of the component placement regions 213 shown as "window". When the multi-chip stacked packages 100 are attached inside the component placement regions 213, preferably, the corner alignment marks 217 or the peripheral alignment marks 218 are not be covered by the multi-chip stacked packages 100. Different materials can be used to form the alignment marks which can be embedded or inlaid on the transparent reconstructed wafer 210.

Therefore, the method for wafer-level testing diced multi-chip stacked packages in the present invention can be easily adapted in the existing wafer testers to achieve fine-pitch probing of substrate-less or chip-scale multi-chip stacked packages without an interposer to provide good diced multi-chip stacked packages after testing and to avoid SMT of bad diced multi-chip stacked packages with lower cost.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A method for wafer-level testing a plurality of diced multi-chip stacked packages, comprising the steps of:
   providing the plurality of multi-chip stacked packages where each multi-chip stacked package includes a plurality of chips vertically stacked together and has a top surface, a bottom surface, and a plurality of testing electrodes disposed on the top surface;
   fixing the multi-chip stacked packages on a transparent reconstructed wafer according to a die-on-wafer array arrangement wherein the transparent reconstructed wafer includes a plurality of component placement regions defined by a plurality of alignment marks and has a photosensitive adhesive adhered to the bottom surfaces of the multi-chip stacked packages to locate the multi-chip stacked packages within the component placement regions, wherein the transparent reconstructed wafer further has a barcode of wafer ID disposed at an edge of the transparent reconstructed wafer outside the component placement regions;
   loading the transparent reconstructed wafer with the multi-chip stacked packages into a wafer tester;
   using a plurality of probes of a probe card installed in the wafer tester to probe the testing electrodes to electrically test the multi-chip stacked packages; and
   radiating light on the photosensitive adhesive through the transparent reconstructed wafer to pick up and sort out the multi-chip stacked packages.

2. The method as claimed in claim 1, wherein the transparent reconstructed wafer is a glass disc.

3. The method as claimed in claim 1, wherein the step of providing the multi-chip stacked packages includes the following sub-steps:
   disposing a plurality of substrate-less chip-stacked cubes on an adhesive tape, each substrate-less chip-stacked cube consisting of the chips with a gap formed between the adjacent vertically stacked chips wherein the testing electrodes are relatively away from the adhesive tape; and
   forming an encapsulation material on the adhesive tape to completely fill the gap between the adjacent vertically stacked chips.

4. The method as claimed in claim 3, wherein the step of providing the multi-chip stacked packages further includes the following sub-step:
   removing a bleeding portion of the encapsulation material exceeding the footprints of the substrate-less chip-stacked cubes after forming the encapsulation material.

5. The method as claimed in claim 4, wherein the encapsulation material still encapsulates a plurality of sidewalls of the chips after removing the bleeding portion.

6. The method as claimed in claim 5, wherein the encapsulation material is a positive-photoresist type underfill, wherein the bleeding portion is removed by exposure and development of the encapsulation material.

7. The method as claimed in claim 4, wherein the adhesive tape is pre-disposed in an opening of a strip-type tape carrier to simulate a substrate strip before the step of disposing the substrate-less chip-stacked cubes on the adhesive tape.

8. The method as claimed in claim 1, wherein a plurality of through-silicon vias are disposed inside each chip and a plurality of micro bumps are disposed in the gap between the adjacent vertically stacked chips to electrically connect to the through-silicon vias.

9. The method as claimed in claim 8, wherein each multi-chip stacked package further has a plurality of external bumps disposed on the top surface.

10. The method as claimed in claim 1, wherein the alignment marks include a plurality of X-axes and a plurality of Y-axes without covering by the multi-chip stacked packages after fixing the multi-chip stacked packages on the transparent reconstructed wafer.

11. The method as claimed in claim 10, wherein the X-axes and the Y-axes extend to the peripheries of the transparent reconstructed wafer.

12. The method as claimed in claim 1, wherein the alignment marks include a plurality of central alignment marks corresponding to the component placement regions.

13. The method as claimed in claim 1, wherein the alignment marks include a plurality of corner alignment marks at the corners of the component placement regions.

14. The method as claimed in claim 1, wherein the alignment marks include a plurality of peripheral alignment marks within the component placement regions.

15. A method for wafer-level testing a plurality of diced multi-chip stacked packages, comprising the steps of:
   providing the plurality of multi-chip stacked packages where each multi-chip stacked package includes a plurality of chips vertically stacked together and has a top surface, a bottom surface, and a plurality of testing electrodes disposed on the top surface;
   fixing the multi-chip stacked packages on a transparent reconstructed wafer according to a die-on-wafer array arrangement wherein the transparent reconstructed wafer includes a plurality of component placement regions defined by a plurality of alignment marks and has a photosensitive adhesive adhered to the bottom surfaces of the multi-chip stacked packages to locate the multi-chip stacked packages within the component placement regions, wherein the alignment marks include a plurality of central alignment marks corresponding to the component placement regions;
   loading the transparent reconstructed wafer with the multi-chip stacked packages into a wafer tester;
   using a plurality of probes of a probe card installed in the wafer tester to probe the testing electrodes to electrically test the multi-chip stacked packages; and
   radiating light on the photosensitive adhesive through the transparent reconstructed wafer to pick up and sort out the multi-chip stacked packages.

* * * * *